(12) United States Patent
Okada (10) Patent No.: US 7,847,607 B2
(45) Date of Patent: Dec. 7, 2010

(54) PLL CIRCUIT

(75) Inventor: Koji Okada, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/987,003

(22) Filed: Nov. 26, 2007

(65) Prior Publication Data

US 2008/0136474 A1   Jun. 12, 2008

(30) Foreign Application Priority Data

Nov. 27, 2006   (JP) .............................. 2006-318638

(51) Int. Cl.
*H03L 7/06* (2006.01)
(52) U.S. Cl. ..................................... 327/156; 327/147
(58) Field of Classification Search ......... 327/147–150, 327/156–159
See application file for complete search history.

(56) References Cited

U.S. PATENT DOCUMENTS

| 5,629,651 A | 5/1997 | Mizuno |
| 6,243,784 B1 * | 6/2001 | Anderson et al. ........... 713/401 |
| 6,690,240 B2 * | 2/2004 | Maxim et al. .................. 331/17 |
| 6,794,912 B2 * | 9/2004 | Hirata et al. ................. 327/158 |
| 6,998,923 B2 * | 2/2006 | Melanson ..................... 331/17 |
| 7,271,788 B2 * | 9/2007 | Vu ............................... 345/87 |
| 2006/0132244 A1 | 6/2006 | Hayashi | |

FOREIGN PATENT DOCUMENTS

| JP | 08-056157 A | 2/1996 |
| JP | 2005-079835 A | 3/2005 |
| JP | 2006-174243 A | 6/2006 |

* cited by examiner

*Primary Examiner*—Hai L Nguyen
(74) *Attorney, Agent, or Firm*—Arent Fox LLP (57) ABSTRACT

A phase locked loop (PLL) circuit including a phase comparator for comparing a phase of a reference signal with a phase of a feedback signal, an oscillator for outputting an output signal at a frequency in accordance with an output of the phase comparator, a feedback loop for returning the output signal of the oscillator and supplying the output signal as the feedback signal, and a delay circuit for delaying the phase of the output signal output from the oscillator to a load circuit, wherein the delay circuit is provided outside the feedback loop.

5 Claims, 13 Drawing Sheets

FIG.1

Related Art

FIG.2

Related Art

PLL CIRCUIT

CROSS-REFERENCE TO RELATED APPLICATIONS

This application claims the benefit of priority of Japanese Patent Application No. 2006-318638, filed on Nov. 27, 2006, the entire contents of which are incorporated herein by reference.

BACKGROUND

1. Field of the Disclosure

The embodiments relate to a phase locked loop (PLL).

2. Description of the Related Art

In the field of semiconductor integrated circuit (IC) devices, technological development is in progress to achieve further enhancement of operation speeds and further reduction of power consumption. In a PLL circuit in a semiconductor IC device, reduction in noise occurring along the time axis, which is called "jitter," is desired. In particular, in a semiconductor IC device including both analog and digital circuits, noise attributed to a digital circuit causes a PLL circuit to generate jitter.

Figure 1:
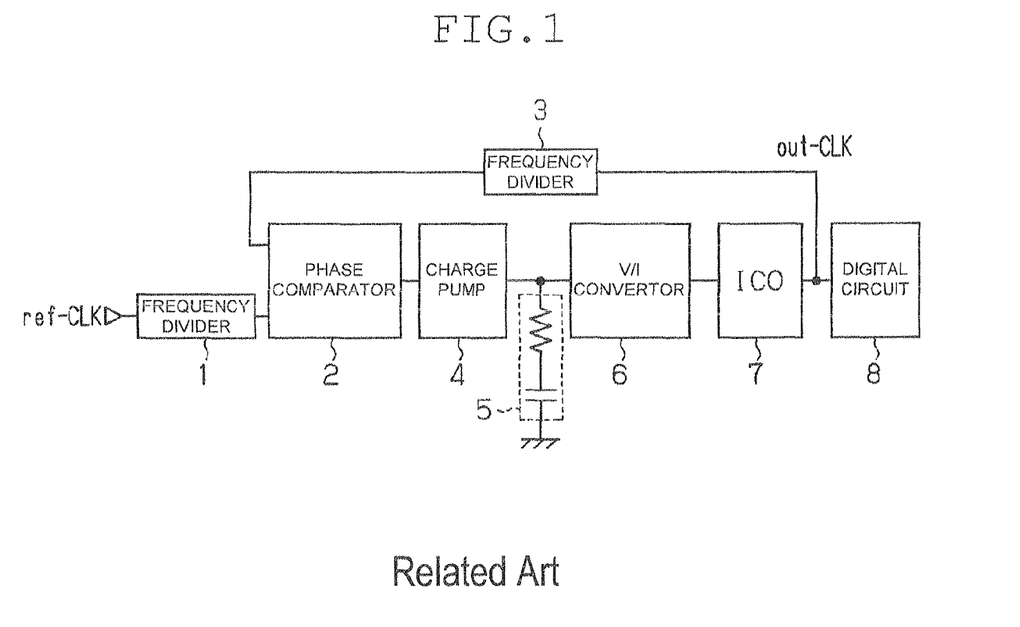
FIG. 1 illustrates a block diagram of a conventional PLL circuit.

FIG. 1 illustrates an example of a conventional PLL circuit. In the conventional PLL circuit, a frequency of a reference signal ref-CLK generated from an oscillator circuit (not shown), such as a quartz oscillator, is divided into a 1/N frequency component by a first frequency divider 1, and is then input into a phase comparator 2. An output signal of a second frequency divider 3 having a division ratio of 1/M, for example, is input as a feedback signal into the phase comparator 2. The phase comparator 2 detects a phase difference between the output signals of the first frequency divider 1 and the output signal of the second frequency divider 3, and outputs a pulse signal in accordance with the phase difference to a charge pump 4.

As shown in FIG. 1, the charge pump 4 outputs an output voltage to a low pass filter 5 (LPF), in accordance with the pulse signal output from the phase comparator 2. The output voltage of the charge pump 4 has a DC component and a pulse component from the pulse signal output from the phase comparator 2. The DC component varies in accordance with frequency variation of the pulse signal, and the pulse component varies in accordance with the pulse signal corresponding to the phase difference.

As further shown in FIG. 1, the low pass filter 5 smoothes the output voltage of the charge pump 4, and outputs an output signal with a removed high frequency component to a voltage/current converter (V/I converter) 6. The V/I converter 6 converts the output voltage of the low pass filter 5 to a current, and outputs the current to a current control oscillator (ICO) 7.

As further shown in FIG. 1, the ICO 7 outputs an output signal out-CLK, having a frequency based on the output current of the V/I converter 6, to a digital circuit 8 and to the second frequency divider 3. The digital circuit 8 performs required operations in accordance with the output signal out-CLK.

The PLL circuit of FIG. 1 operates so as to conform the frequency and phase of the output signal of the second frequency divider 3 to the frequency and phase of the output signal of the first frequency divider 1.

Figure 2:
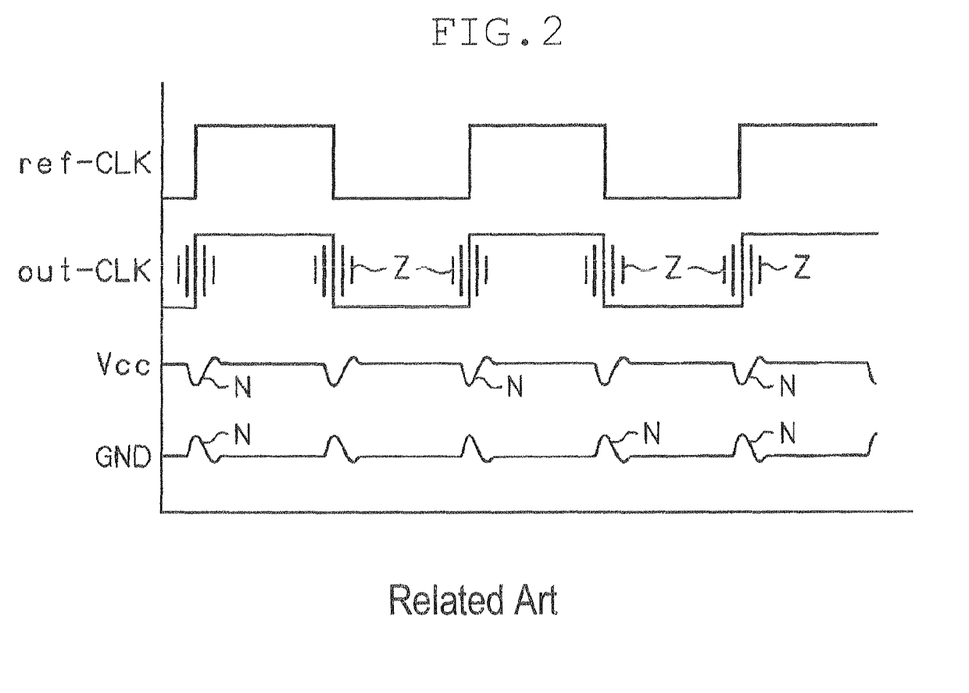
FIG. 2 illustrates a timing diagram of operation of the conventional PLL circuit of FIG. 1.

FIG. 2 illustrates an operation in the case where the division ratio of each of the respective first and second frequency dividers 1 and 3 of FIG. 1 is 1. In accordance with the loop from the phase comparator 2 of FIG. 1 to the ICO 7 of FIG. 1, the frequency and phase of the output signal out-CLK converge, so that the reference signal ref-CLK and the output signal out-CLK are in-phase with each other.

As shown in FIG. 2, upon output of the output signal out-CLK from the ICO 7 of FIG. 1, the digital circuit 8 of FIG. 1 operates a required switching operation, in accordance with a timing of a rise and fall of the output signal out-CLK. Therefore, in accordance with the operation of the digital circuit 8, power-supply noise N, synchronous with the output signal out-CLK, is generated in a power supply Vcc potential and a ground GND potential that are supplied to the respective circuits, which are coupled between the phase comparator 2 and the ICO 7 through power supply lines.

As further shown in FIG. 2, since a comparison operation is performed in the phase comparator 2 of FIG. 1 in accordance with a timing of a rise or fall of the reference signal ref-CLK, the output signal is destabilized, due to the power-supply noise N. The output signal of the charge pump 4 of FIG. 1, operating on the common power supply with the digital circuit 8, is also destabilized.

As a consequence, as shown further in FIG. 2, a jitter Z frequently occurs during the rise and fall of the output signal out-CLK.

As one example of a related conventional technique, Laid-Open Japanese Patent Application (JP-A) No. 2005-79835 discloses a PLL circuit that includes a phase shifter interposed between a voltage control oscillator and a frequency divider to reduce jitter occurrence. However, in such a configuration, which includes the phase shifter in a feedback loop that feeds back the output signal of the voltage control oscillator to the phase comparator, the loop affects the lock-up speed until the frequency of the output signal of the voltage control oscillator is stabilized. Since the delay time caused as a result of the phase shifter has to be adjusted optimally, the phase shifter must include a delay length switching portion. Consequently, the circuit size of the phase shifter is increased.

As another example, JP-A-2006-174243 discloses a PLL circuit, in which a delay value of a delay circuit in a voltage control oscillator is controlled to enable stepwise switching of an oscillation frequency characteristic. However, a jitter reduction feature is not disclosed.

As still another example, JP-A-08-56157 discloses a PLL circuit that includes a variable delay circuit provided with a voltage control circuit. However, a jitter reduction feature is not disclosed.

Conventional PLL circuits, such as described above, are problematic at least in that, when the timing of occurrence of power-supply noise N with the output signal out-CLK and the phase comparison timing in the phase comparator 2 overlap, the jitter Z increases in the output signal out-CLK.

SUMMARY

Embodiments provide a PLL circuit that includes a phase comparator for comparing the phase of a reference signal with the phase of a feedback signal, an oscillator for outputting an output signal at a frequency in accordance with output of the phase comparator, a feedback loop for returning the output signal of the oscillator and supplying the output signal as the feedback signal, and a delay circuit for delaying the phase of the output signal output from the oscillator to a load circuit, wherein the delay circuit is provided outside the feedback loop.

These aspects of the PLL circuit, together with other aspects and advantages, which will be subsequently apparent, reside in the details of construction and operation thereof, as more fully hereinafter described and claimed herein, reference being had to the accompanying drawings forming a part hereof, wherein like numerals refer to like parts throughout.

DETAILED DESCRIPTION OF THE EMBODIMENTS

In the following descriptions, many of the exemplary circuits are shown to include n-channel metal-oxide-semiconductor field-effect transistors (MOSFETs) in a variety of configurations. While MOSFET devices are used by example, the disclosed circuits may be implemented using any number of other transistor types, such as J-FETs, bipolar transistors, and so on. Additionally, while n-channel devices are used in the following examples, the same general approaches may also apply to circuits incorporating p-channel FETs or PNP bipolar transistors, for example.

Still further, while terms "drain" and "source" are used for ease of explanation and to adhere to traditional engineering usage, it should be recognized that a drain and source of a FET transistor may be considered interchangeable, and for the following descriptions merely thought of as a first end and a second end of a semiconductor channel unless otherwise stated or apparent to one of ordinary skill in the art.

Figure 3:
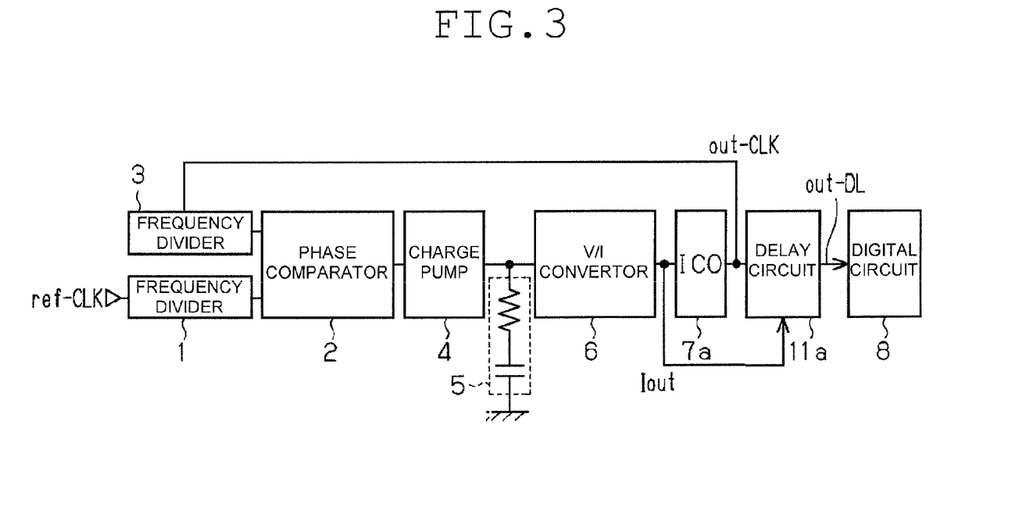
FIG. 3 illustrates a block diagram of a first exemplary PLL circuit, in accordance with an embodiment.

FIG. 3 illustrates a first exemplary PLL circuit in accordance with an embodiment. In the drawings and description hereinafter, like reference characters refer to the similar components/portions as those of the conventional example. A phase comparator 2 of FIG. 3 performs a comparison between a reference signal output from a first frequency divider 1 and a feedback signal output from a second frequency divider 3, and outputs a phase difference signal to a charge pump 4.

As shown in FIG. 3, an output signal out-CLK of an ICO 7a is output to a digital circuit 8 (load circuit) via a delay circuit 11a.

Figure 4:
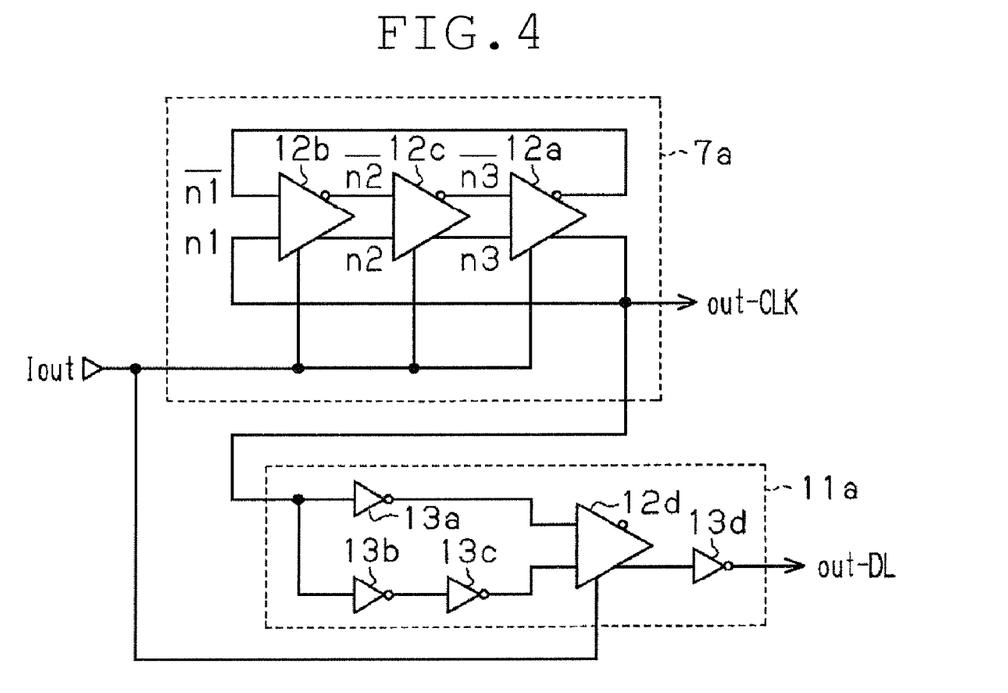
FIG. 4 illustrates an ICO (current control oscillator) and a delay circuit for the PLL circuit of FIG. 3.

FIG. 4 illustrates more specific exemplary configurations of the ICO 7a of FIG. 3 and the delay circuit 11a of FIG. 3. In the ICO 7a of FIG. 4, differential amplifiers 12a to 12c are coupled to one another in a ring shape, in which an output current Iout of a V/I converter 6 of FIG. 3 is supplied to the respective differential amplifiers 12a to 12c.

Figure 5:
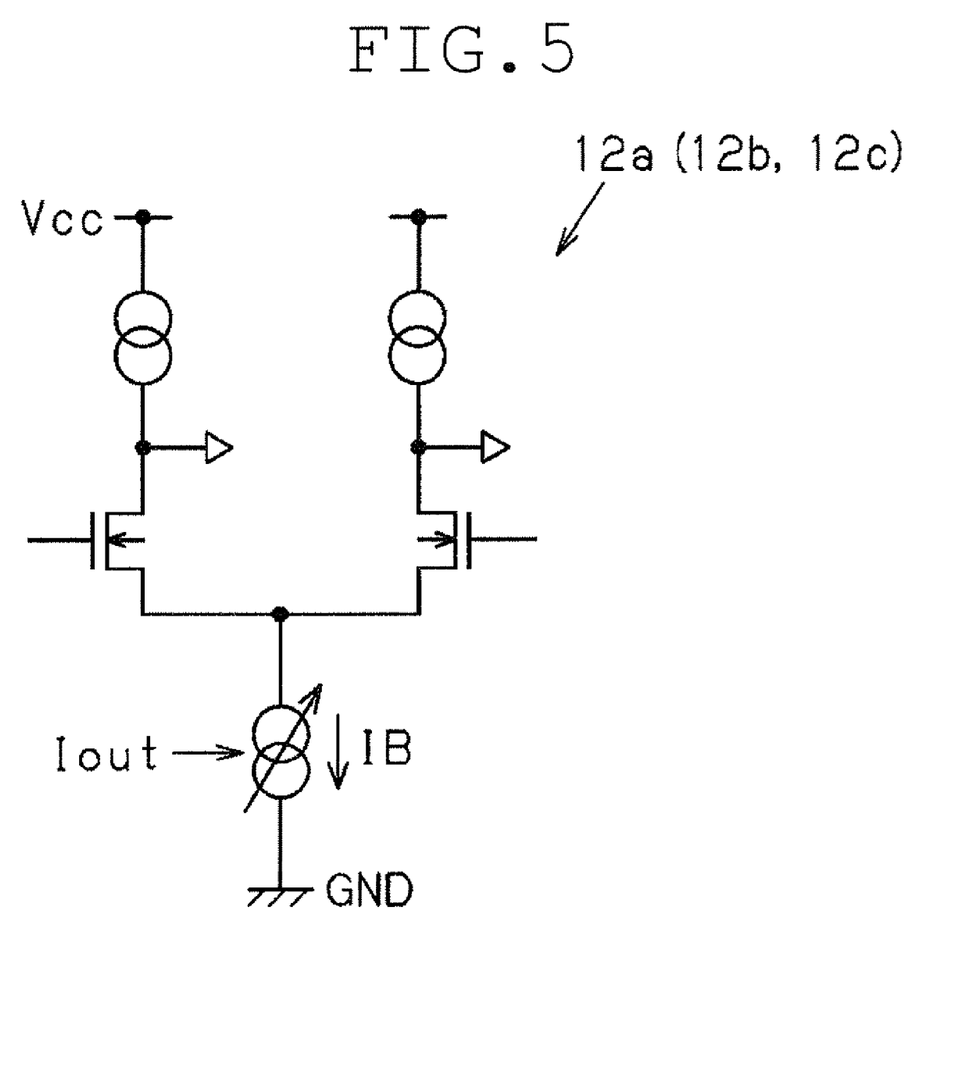
FIG. 5 illustrates a differential amplifier for the circuit of FIG. 4.

As shown in FIG. 5, the differential amplifiers 12a to 12c of FIG. 4 are each configured such that a bias current IB thereof varies with variations in the output current Iout of the V/I converter 6 of FIG. 3. According to a configuration shown in FIG. 5, in the ICO 7a of FIG. 4, the frequency of the output signal out-CLK is varied due to variations in the output current Iout of the V/I converter 6 of FIG. 3.

Figure 6:
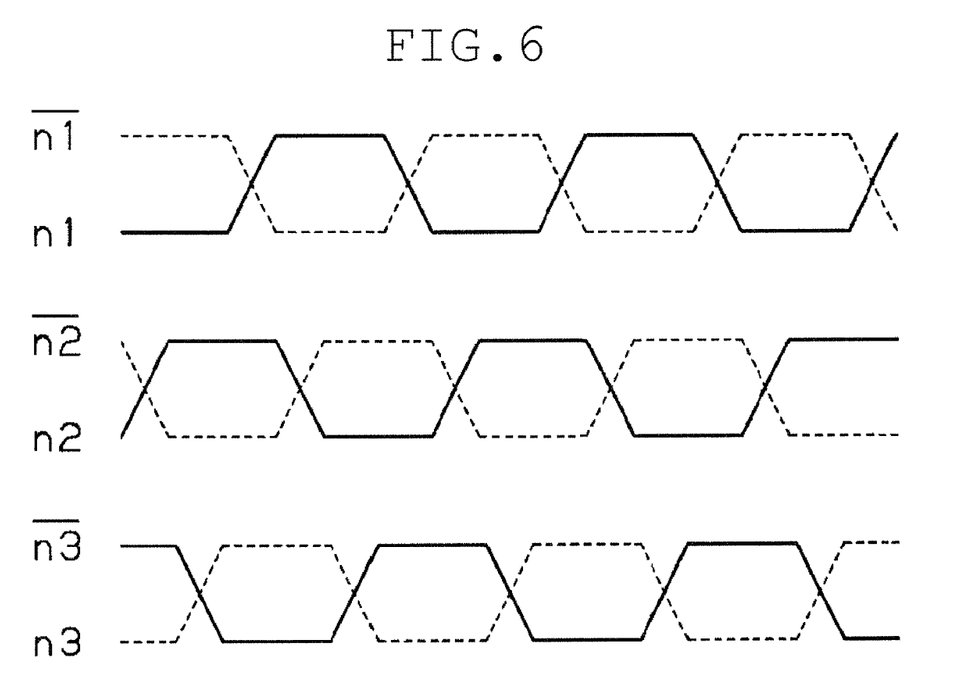
FIG. 6 illustrates an exemplary timing diagram of operation of the ICO for the circuit of FIG. 4.

FIG. 6 illustrates output signal waveforms of the ICO 7a of FIG. 4, configured as a function of the three differential amplifiers 12a to 12c. As shown in FIG. 6, output signals n1, bar-n1 to n3, and bar-n3, respectively, have waveforms shifted by a predetermined interval.

As shown in FIG. 4, in the delay circuit 11a, phase inverted signals are generated by inverter circuits 13a to 13c from the output signal out-CLK of the ICO 7a, and the phase inverted signals are input into a differential amplifier 12d. The differential amplifier 12d has a similar configuration to each of the respective differential amplifiers 12a to 12c. Similarly, as in the ICO 7a, the output current Iout of the V/I converter 6 of FIG. 3 is input as a bias current into each of the differential amplifiers 12a to 12c. Consequently, in the delay circuit 11a, a delay time is generated for the output signal out-CLK of the ICO 7a at a constant rate at all times.

Figure 7:
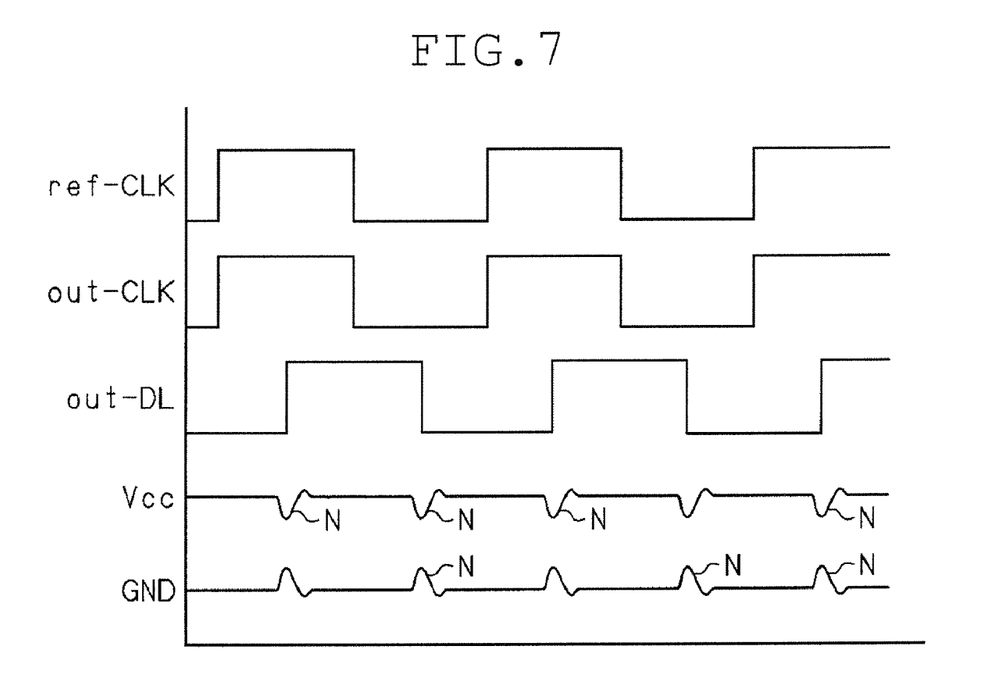
FIG. 7 illustrates an exemplary timing diagram of operation of the PLL circuit of FIG. 3.

As shown in FIG. 7, in the configuration in which the ICO 7a of FIG. 4 is configured as a function of the three differential amplifiers 12a to 12c, an output signal out-DL of the delay circuit 11a of FIG. 4 is formed to have a waveform that is ⅙ cycle delayed relative to the output signal out-CLK of the ICO 7a. The output signal of the differential amplifier 12d is output to the digital circuit 8 via an inverter circuit 13d of FIG. 4.

As further shown in FIG. 7, when the division ratio of each of the first and second frequency dividers 1 and 3 is assumed to be about 1, the frequency and phase of the output signal out-CLK converge to be in-phase with the reference signal ref-CLK in accordance with the loop in the range from the phase comparator 2 to the ICO 7a of FIG. 3.

As further shown in FIG. 7, an output signal out-DL, which is obtained by delaying the output signal out-CLK of the ICO 7a by the ⅙ cycle, is generated by the delay circuit 11a of FIG. 4, and the output signal out-DL is output to the digital circuit 8.

As further shown in FIG. 7, in the digital circuit 8 of FIG. 3, a necessary switching operation is performed in accordance with the rising and falling of the output signal out-DL of the delay circuit 11a. With operation of the digital circuit 8, noise N, synchronous with the output signal out-DL, is generated in a power supply Vcc potential and a ground GND potential supplied to the respective circuits through the loop in the range from the phase comparator 2 to the ICO 7a. In this case, however, the power-supply noise N is not synchronous with the rising and falling of the reference signal ref-CLK, that is, comparison timing in the phase comparator 2.

Among other things, the PLL circuit of FIG. 3 enables the following effects and advantages to be achieved:

(1) Since the output signal out-CLK of the ICO 7a is output to the digital circuit 8 via the delay circuit 11a, the occurrence of power-supply noise N attributed to the operation of the digital circuit 8 and the occurrence of comparison timing by the phase comparator 2 may be controlled so as not to overlap. Consequently, the occurrence of jitter in the output signal out-CLK of the ICO 7a may be suppressed.

(2) The delay circuit 11a has a similar configuration to each of the respective differential amplifiers 12a to 12c constituting the ICO 7a. The delay circuit 11a is also supplied with the output current Iout of the V/I converter 6, as the bias current commonly supplied to the differential amplifiers 12a to 12c to configure the circuit for automatically adjusting the delay time. Consequently, the delay time in the delay circuit 11a is generated at all times at a constant rate relative to the cycle of the output signal out-CLK of the ICO 7a. The delay time of the delay circuit 11a may be automatically adjusted as a function of variations in the frequency of the output signal out-CLK of the ICO 7a.

(3) The delay circuit 11a may be configured to include the single differential amplifier 12d, which has the same configuration as each of the differential amplifiers 12a to 12c. Consequently, the delay circuit 11a may be formed into a simplified configuration.

FIGS. 8 to 11 illustrate a second exemplary PLL circuit, in accordance with embodiments, which includes an ICO 7b and a delay circuit 11b, respectively, in place of the ICO 7a and the delay circuit 11a of FIG. 3. The ICO 7b includes an odd number of inverter circuits, and the delay circuit 11b includes an inverter circuit having the same configuration as the respective inverters of the ICO 7b. Other portions of the configuration are similar to corresponding portions of the first PLL circuit of FIG. 3.

Figure 8:
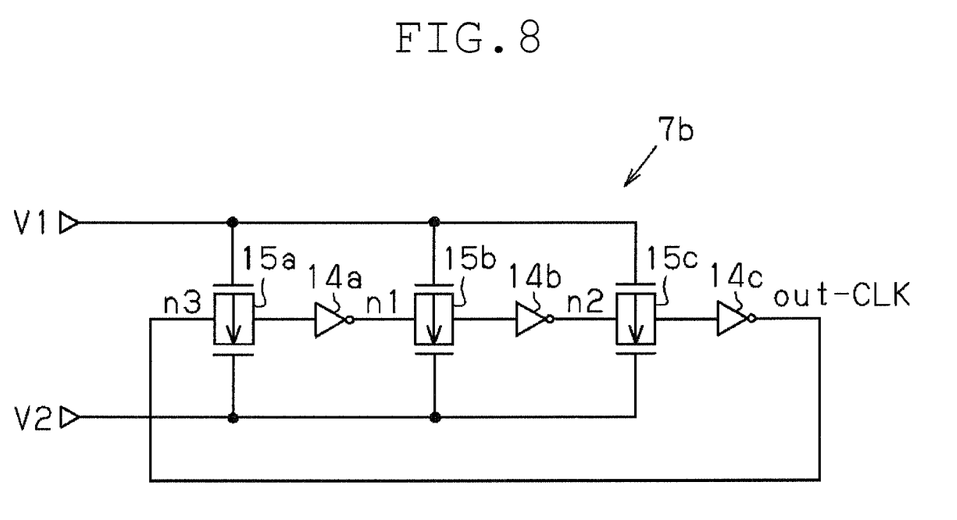
FIG. 8 illustrates an ICO of a second exemplary PLL circuit, in accordance with an embodiment.

As shown in FIG. 8, in the ICO 7b, an odd number of inverter circuits (14a to 14c) are coupled to one another in a ring shape via respective transfer gates 15a to 15c. The transfer gates 15a to 15c are each configured in such a manner that a P-channel MOS transistor (PMOS) and an N-channel MOS transistor (NMOS) are coupled together in parallel. A common control voltage V1 is input to PMOS-side gate terminals of the respective transfer gates 15a to 15c, and a common control voltage V2 is input to NMOS gate terminals of the respective transfer gates 15a to 15c.

As further shown in FIG. 8, when the control voltage V1 decreases, the control voltage V2 increases, and the transfer currents of the transfer gates 15a to 15c are increased thereby, the frequency of the output signal out-CLK of the ICO 7b is increased. In contrast, when the control voltage V1 increases, the control voltage V2 decreases, and the transfer current of the transfer gates 15a to 15c is decreased thereby, the frequency of the output signal out-CLK of the ICO 7b is decreased.

Figure 9:
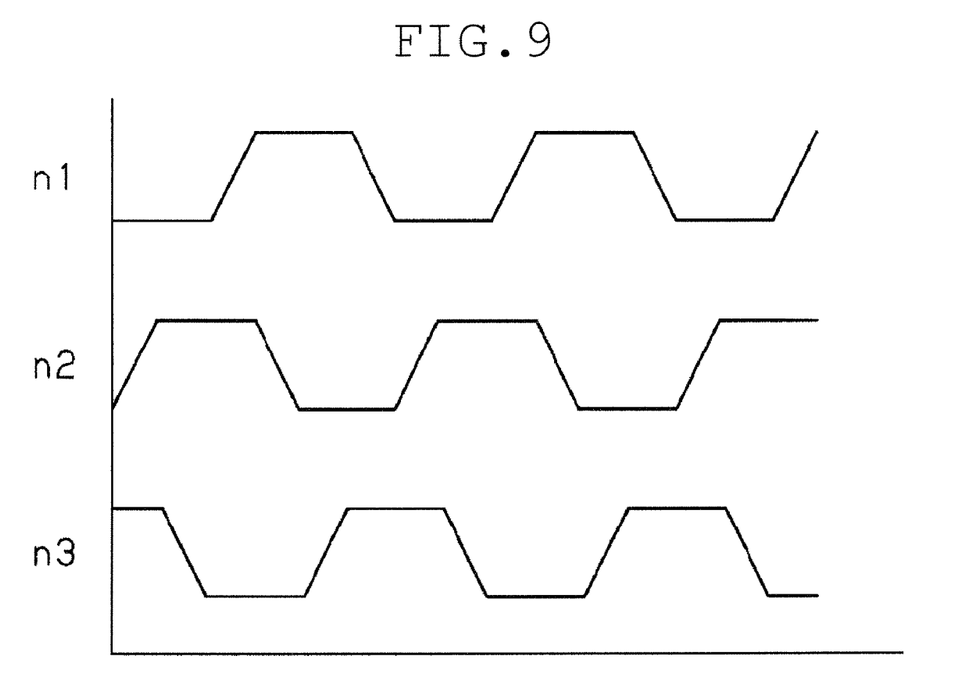
FIG. 9 illustrates an exemplary timing diagram of operation of the ICO for the PLL circuit of FIG. 8.

As further shown in FIG. 9, the waveforms of output signals n1 to n3 of the respective inverter circuits 14a to 14c of FIG. 8 are shifted by a predetermined interval.

Figure 10:
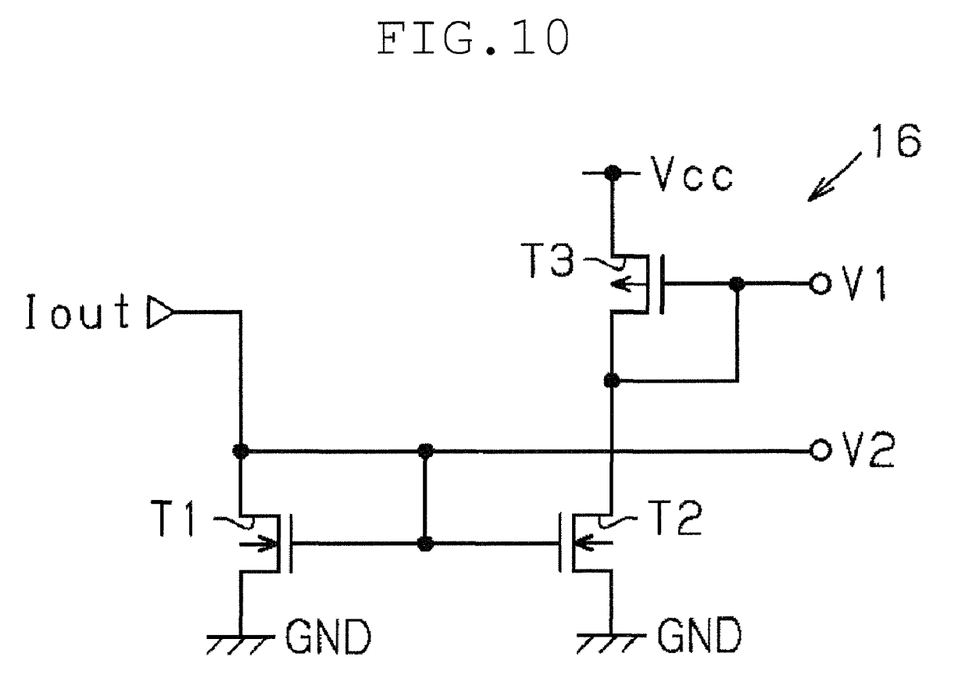
FIG. 10 illustrates an exemplary control voltage generator unit for the PLL circuit of FIG. 8.

As shown in FIG. 10, a control voltage generator unit 16 generates the control voltages V1 and V2 of FIG. 8. More specifically, the output current Iout of the V/I converter 6 of FIG. 3 is supplied to the drains of NMOS transistors T1 and T2 of FIG. 10 and the drain of the NMOS transistor T1. The sources of the transistors T1 and T2 are coupled to a ground GND, thereby producing a current mirror circuit. A drain voltage of the transistor T1 is supplied as the control voltage V2.

As further shown in FIG. 10, the drain of the transistor T2 is coupled to the drain and gate of a PMOS transistor T3, and the source of the transistor T3 is coupled to a power supply Vcc. The control voltage V1 is output from the drain of the transistor T3.

As further shown in FIG. 10, in the control voltage generating portion 16, when the output current Iout of the V/I converter 6 of FIG. 3 increases, the control voltage V2 is increased and the drain voltage of the transistor T2 is increased, whereby the control voltage V1 is decreased. In contrast, when the output current Iout of the V/I converter 6 of FIG. 3 decreases, the control voltage V2 is decreased, and the drain current of the transistor T2 is decreased, whereby the control voltage V1 is increased.

Figure 11:
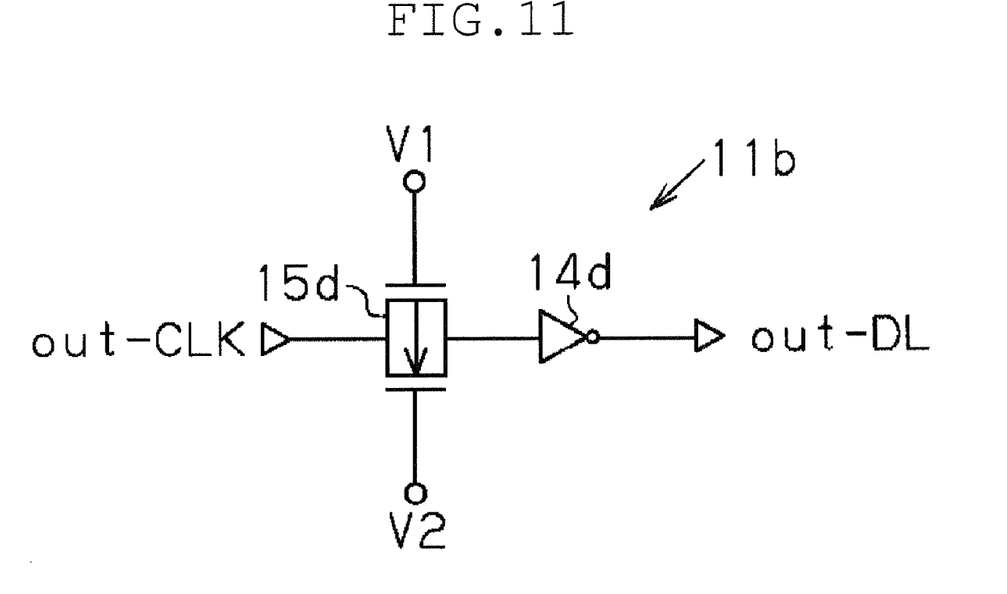
FIG. 11 illustrates an exemplary delay circuit for the PLL circuit of FIG. 8.

FIG. 11 illustrates the delay circuit 11b. The delay circuit 11b includes a transfer gate 15d and an inverter circuit 14d. The control voltage V1 is input to a PMOS-side gate of the transfer gate 15d, and the control voltage V2 is input to an NMOS-side gate of the transfer gate 15d. The output signal out-CLK of the ICO 7b of FIG. 8 is output as the output signal out-DL to the digital circuit 8 of FIG. 3 via the transfer gate 15d and the inverter circuit 14d.

As shown in FIG. 11, in the delay circuit 11b, when the control voltage V1 is decreased, the control voltage V2 is increased, and the transfer current of the transfer gate 15d is increased thereby, the delay time of the delay circuit 11b is decreased. In contrast, when the control voltage V1 is increased, the control voltage V2 is decreased, and the transfer current of the transfer gate 15d is decreased thereby, the delay time of the delay circuit 11b is increased.

When the frequency of the output signal out-CLK of the ICO 7b of FIG. 8 is increased, the delay time of the delay circuit 11b of FIG. 11 is decreased. In contrast, when the frequency of the output signal out-CLK of the ICO 7b of FIG. 8 is decreased, the delay time of the delay circuit 11b of FIG. 11 is increased. Consequently, a delay time in the delay circuit 11a is generated at all times at a constant rate relative to the cycle of the output signal out-CLK of the ICO 7b.

Accordingly, in the PLL circuit that includes the ICO 7b of FIG. 8 and the delay circuit 11b of FIG. 11, effects and advantages similar to those of the first PLL circuit of FIG. 3 may be obtained.

Figure 12:
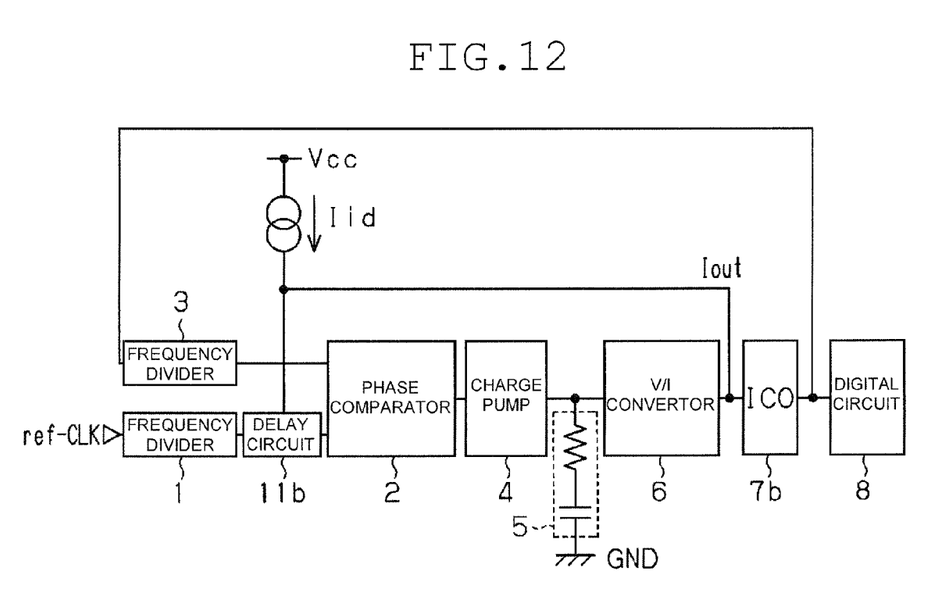
FIG. 12 illustrates a block diagram of a third exemplary PLL circuit, in accordance with an embodiment.

FIG. 12 illustrates a third exemplary PLL circuit, in accordance with an embodiment of. As shown in FIG. 12, in the configuration in which, for example, an ICO 7b is similar to the ICO 7b of the first PLL circuit of FIG. 8, the delay circuit 11b is interposed between the first frequency divider 1 and the phase comparator 2.

As further shown in FIG. 12, in addition to the output current Iout of the V/I converter 6, an idling current Iid is supplied to the delay circuit 11b. Even in a state where the output current Iout of the V/I converter 6 is not supplied at the time of activation of the PLL circuit of FIG. 12, the reference signal ref-CLK is supplied to the phase comparator 2 when the idling current Iid is supplied to the delay circuit 11b.

As further shown in FIG. 12, in the configuration that includes a delay circuit 11b interposed between the first frequency divider 1 and the phase comparator 2, the configuration enters into a state in which the comparison timing in the phase comparator 2 does not overlap the timing of the rising and falling of the output signal out-CLK of the ICO 7b. Consequently, occurrence of jitter in the output signal out-CLK of the ICO 7b may be suppressed.

Figure 13:
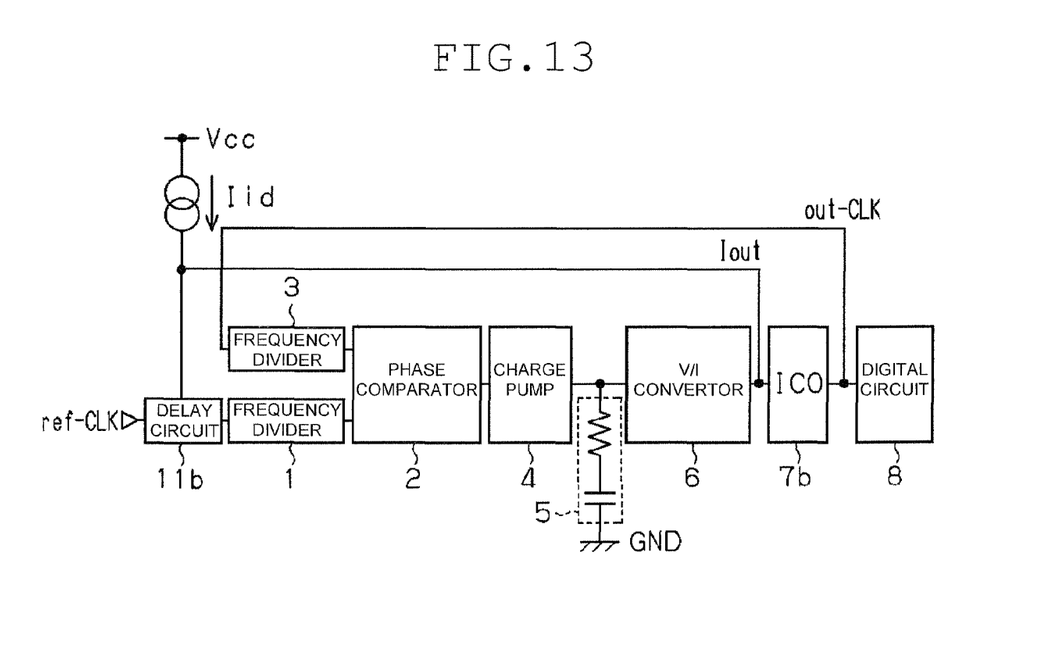
FIG. 13 illustrates a block diagram of a fourth exemplary PLL circuit, in accordance with an embodiment.

FIG. 13 illustrates a fourth exemplary PLL circuit, in accordance with an embodiment. As shown in FIG. 13, a delay circuit 11b similar to the delay circuit 11b of FIG. 12 is interposed before the first frequency divider 1. The PLL circuit of FIG. 13 enables similar effects and advantages to be obtained to those of the PLL circuit of FIG. 12.

The ICO 7a and delay circuit 11a of the first PLL circuit of FIG. 3 may be used instead of the respective ICO 7b and delay circuit 11b of the respective PLL circuits of FIGS. 12 and 13.

According to any one of the embodiments described above, the PLL circuit capable of suppressing jitter occurrence in the output signal may be provided without insertion of the delay circuit in the feedback loop and without introducing circuit size enlargement.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A phase locked loop (PLL) circuit, comprising:
   a phase comparator for comparing a phase of a reference signal with a phase of a feedback signal;
   an oscillator for outputting an output signal having a frequency in accordance with an output of the phase comparator;
   a feedback loop for returning the output signal of the oscillator and supplying the output signal as the feedback signal;
   a delay circuit for controlling a delay time of the output signal of the oscillator according to a phase difference between the reference signal and the feedback signal,
   wherein the delay circuit is provided outside the feedback loop; and
   a voltage/current converter for converting a voltage in accordance with an output of the phase comparator;
   wherein the oscillator is a current controlled oscillator that includes differential amplifiers coupled to one another in a ring shape,
   wherein an output current of the voltage/current converter is supplied as a bias current to the differential amplifiers included in the current controlled oscillator, and
   wherein the delay circuit includes a differential amplifier having a same configuration as the differential amplifiers of the current controlled oscillator.

2. The PLL circuit according to claim 1, wherein the output signal of the current controlled oscillator is output to a load circuit via the delay circuit.

3. The PLL circuit according to claim 1, wherein the delay circuit controls the delay time so as to keep a given rate relative to a cycle of the output signal of the oscillator.

4. The PLL circuit according to claim 1, wherein the delay circuit controls the delay time to decrease when the frequency increases.

5. The PLL circuit according to claim 1, wherein the delay circuit controls the delay time to increase when the frequency decreases.

* * * * *